United States Patent [19]
von Basse

[11] 4,099,162
[45] Jul. 4, 1978

[54] DECODER CIRCUIT

[75] Inventor: Paul-Werner von Basse, Wolfratshausen-Farchet, Germany

[73] Assignee: Siemens Aktiengesellschaft, Berlin & Munich, Germany

[21] Appl. No.: 749,010

[22] Filed: Dec. 9, 1976

[30] Foreign Application Priority Data

Dec. 18, 1975 [DE] Fed. Rep. of Germany ....... 2557165

[51] Int. Cl.² .................... G11C 5/02; H03K 13/243
[52] U.S. Cl. ............................. 340/166 R; 307/238; 365/182; 365/189
[58] Field of Search ........ 340/166 R, 166 FE, 173 R, 340/173; 307/238, 304

[56] References Cited
U.S. PATENT DOCUMENTS

| | | | |
|---|---|---|---|
| 3,962,686 | 6/1976 | Matsue et al. | 340/173 R |
| 4,021,787 | 5/1977 | Stein et al. | 340/173 R |
| 4,027,294 | 5/1977 | Meusburger et al. | 340/173 CA |
| 4,034,243 | 7/1977 | Love | 340/166 R |

*Primary Examiner*—Donald J. Yusko
*Attorney, Agent, or Firm*—Hill, Gross, Simpson, Van Santen, Steadman, Chiara & Simpson

[57] ABSTRACT

A decoder circuit is disclosed for use with a storage module having storage cells constructed from MOS transistors arranged between word lines and bit lines. In order to select one of the word lines or bit lines, control inputs of the decoder transistors are fed with $n$ address signals in negated or non-negated form and a decoder output signal is emitted on a decoder output line which connects the one terminals of the controlled paths of the decoder transistors. In the decoder, $n-1$ decoder transistors are arranged with their controlled paths in parallel and a further decoder transistor is provided whose control input is supplied with an address signal in negated form and whose controlled path is arranged between a connection line which connects the one ends of the controlled paths of the $n-1$ decoder transistors and an operating voltage. An additional decoder transistor is provided whose control input is fed with the address signal in non-negated form and whose control path is connected between the operating voltage and a second connection line which connects the other ends of the controlled paths of the decoder transistors. Both the first and second connection lines form respective decoder output lines for the selection of a word/bit line.

4 Claims, 8 Drawing Figures

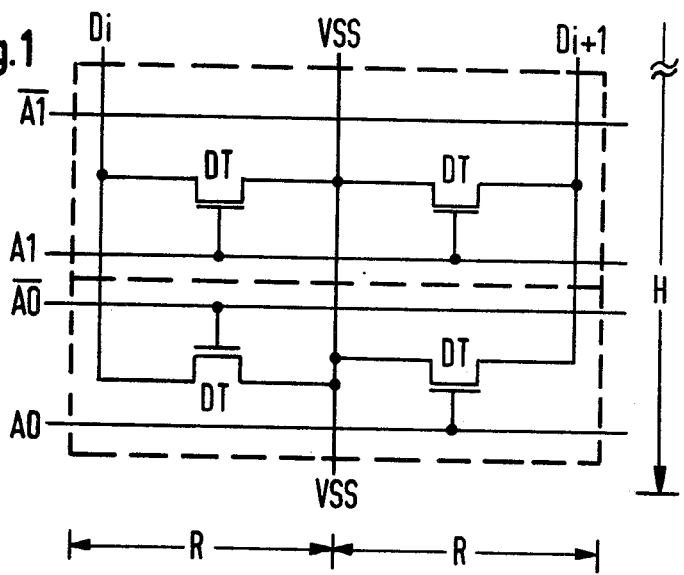
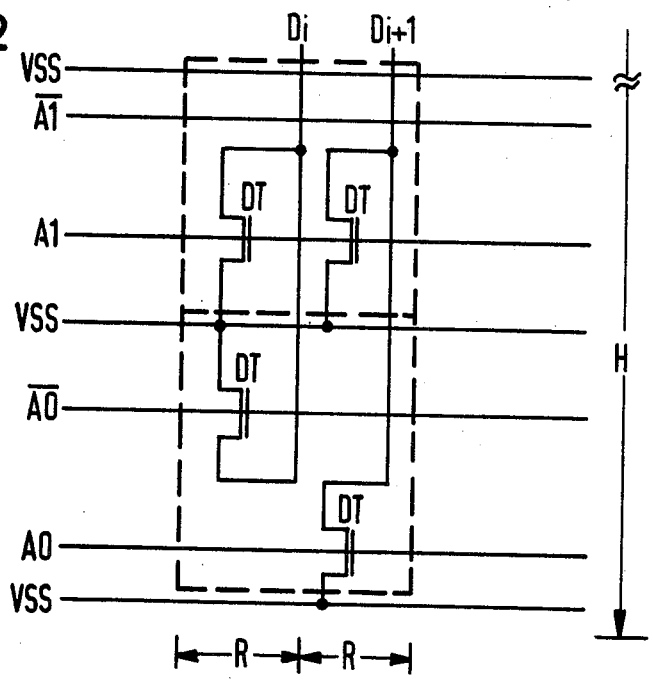

DECODER CIRCUIT

BACKGROUND OF THE INVENTION

1. Field of the Invention

The present invention relates to a decoder circuit for a storage module having storage cells constructed from MOS transistors which are arranged between word and bit lines, and more particularly to such a decoder circuit in which, for the selection of one of the word lines or bit lines, the control inputs of the decoder transistors are fed with $n$ address signals in negated or non-negated form and a decoder output signal is emitted on a decoder output line which connects terminals of the controlled paths of the decoder transistors.

2. Description of the Prior Art

Decoder circuits for storage modules in which the storage cells consist of MOS transistors are arranged between word lines and bit lines as is known, for example, from the IBM Technical Disclosure Bulletin, Vol. 12, No. 13, May 1970, Page 2082. In this publication, a decoder circuit is provided for each bit line and word line. The decoder circuit consists of MOS transistors whose control paths are arranged parallel to one another. In the following, these MOS transistors will be referred to as decoder transistors. The control inputs of these decoder transistors are fed with address signals in non-negated form or in negated form. The one electrodes of the controlled paths of the decoder transistors are connected to one another and form a so-called decoder output line, which generally is connected to an output amplifier which leads to the bit line and word line of the storage module. The other electrodes of the controlled paths of the decoder transistors are likewise connected to one another and then connected to an operating voltage. The mode of operation of such a known decoder circuit is well known in the art and will not be discussed further hereinbelow.

Conventionally, the decoder circuits are integrated, together with the storage cells of a storage module. Therefore, a problem exists in designing the decoder circuits so that they assume a space on the storage module which is as small as possible. To this end, it is known to arrange the decoder transistors on the semiconductor module in parallel to the address lines, whereas the decoder output lines and the lines for the operating voltage are arranged at right angles to the address lines. In this case, the address lines are metal lines, whereas the decoder output lines and the line for the operating voltage are diffused into the semiconductor module. A disadvantage of such an arrangement resides in the fact that the decoder grid formed from the decoder output line to the line for the operating voltage is relatively large.

It is also known to arrange the decoder transistors in parallel to the decoder output lines, whereas the address lines are arranged at right angles to the decoder output lines. In this case, two address lines are, in each case, followed by a line for the operating voltage. Here, the address lines are in the form of silicon address lines. In this embodiment, the decoder grid is smaller than in the previously described situation, although the height of the decoder circuit, which corresponds approximately to the length of the decoder output line, is larger.

SUMMARY OF THE INVENTION

The object of the present invention resides in the provision of a decoder circuit which is designed in such a manner that its integration onto a semiconductor module requires less space than known decoder circuits.

The above object is realized according to the present invention, for a decoder circuit of the type generally described above wherein $n-1$ decoder transistors are arranged with their controlled paths in parallel and a further decoder transistor is provided whose control input is supplied with an address signal in negated form and whose controlled path is arranged between a connection line which connects the one ends of the controlled path of the $n-1$ decoder transistors and an operating voltage. An additional decoder transistor is provided whose control input is fed with the address signal in nonnegated form and whose controlled path is connected between the operating voltage and a second connection line which connects the other ends of the controlled paths of the decoder transistors. Furthermore, the first and second connection lines form respective decoder output lines for the selection of a word line or a bit line.

If the number of the address signal with which a decoder circuit must be operated is referred to as $n$, where $n$ is an integer, $n-1$ decoder transistors are arranged in parallel to one another. This is to say that the controlled paths of these decoder transistors are each connected to one another by a first and a second connection line. A further decoder transistor is provided, whose controlled path lies between an operating voltage and the first connection line of the $n-1$ decoder transistors. This further decoder transistor is operated by an address signal in negated form. Finally, as set forth above, an additional decoder transistor is provided which lies between the second connection line of the $n-1$ decoder transistors and the operating voltage. This additional decoder transistor is operated by the address signal in non-negated form. The first and the second connection lines of the decoder circuit each form a decoder output line, each of which can, for example, be connected to an output amplifier which leads to a word line or a bit line.

A decoder circuit constructed along the line set forth above can be integrated on a semiconductor module in such a manner that the $n-1$ decoder transistors lie parallel to the address lines. On the other hand, the further decoder transistor and the additional decoder transistor are arranged in parallel to the decoder output lines. The line for the operating voltage is required only once and can be located at the edge of the decoder circuit on the storage module. Thus, no internal line is required for the operating voltage within the decoder circuit. The result of this construction is a very small decoder grid, which corresponds approximately to the decoder grid which exists in the known decoder circuit with the silicon address lines, although the decoder circuit of the present invention has a considerably smaller height than the previously known decoder circuit.

A further advantage of the decoder circuit constructed in accordance with the present invention consists in that the address lines can be constructed with metal. This has the advantage of short signal transit times on the address lines. Another and essential advantage consists in that the number of decoder transistors per address line is considerably reduced.

BRIEF DESCRIPTION OF THE DRAWINGS

Other objects, features and advantages of the invention, its organization, construction and operation will be best understood from the following detailed description taken in conjunction with the accompanying drawings on which:

FIG. 1 is a schematic illustration of a known decoder circuit in which the decoder transistors are arranged in parallel to the address lines;

FIG. 2 is a schematic illustration of a known decoder circuit in which the decoder transistors are arranged in parallel to the decoder output lines;

DESCRIPTION OF THE PREFERRED EMBODIMENTS

Figure 6:
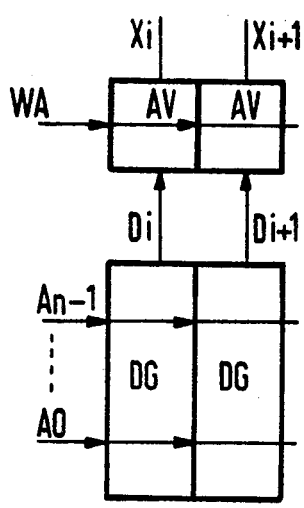
FIG. 6 is a schematic illustration of decoder circuits corresponding to FIG. 1.

Referring to FIG. 1, a known decoder circuit on a storage module is schematically illustrated. In this known decoder circuit, the decoder transistors DT are arranged in parallel to a plurality of address lines A. The controlled paths of the decoder transistors DT lie between a plurality of decoder output lines D and a line for the operating voltage VSS. The control inputs of the decoder transistors DT are each connected to the address lines A. In this example, the address lines are constructed in metal, whereas the decoder output lines and the line for the operating voltage VSS are diffused into the semiconductor module. It can be seen from FIG. 1 that the decoder grid R, which is required for integrating the decoder transistors DT of the decoder circuit on the storage module, is relatively large. This can also be seen from FIG. 6, in which two decoder circuits DG are arranged next to one another and are connected to an output amplifier AV via a decoder output line D$i$ and D$i$+1. The output amplifier AV is fed with a selection timing signal WA. Here again, the decoder grid R is relatively large, whereas the height H of the overall decoder circuit with the output amplifier AV is relatively low. The reason for the low height consists in that the decoder transistors DT lie parallel to the address lines, and because of the large decoder grid R the output amplifiers AV can be arranged next to one another.

FIG. 2 illustrates the arrangement of another known decoder circuit on a storage module. Here, the decoder transistors DT lie in parallel to the decoder output lines D$i$ and D$i$+1. The address lines A are arranged at right angles to the decoder output lines D. Now the decoder output lines D consist of metal, whereas the address lines A consist of silicon. In this embodiment of the decoder circuit, between two address lines is arranged a respective line for the operating voltage VSS which is diffused into the semiconductor substrate.

Figure 7:
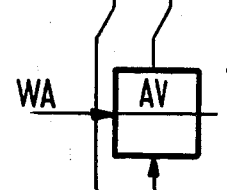
FIG. 7 is a schematic illustration of the decoder circuits corresponding to FIG. 2.

Since the decoder transistors DT now lie parallel to the decoder output lines D, the decoder grid R is relatively small, although the height H of the decoder circuit on the storage module is relatively great. This can be seen better in FIG. 7. Here again, two decoder circuits DG are arranged next to one another. However, the output amplifiers AV are arranged displaced in relation to one another, as in this case the decoder grid R is too small. The result is that the height H of the overall circuit, consisting of the decoder circuit DG and the output amplifier AV becomes great.

Figure 3:
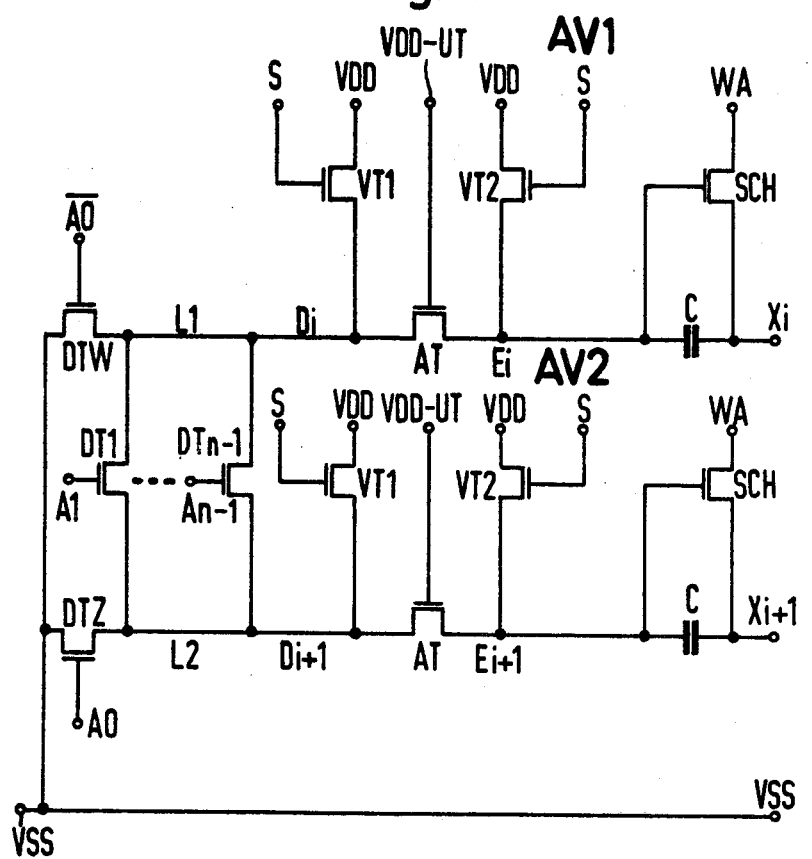
FIG. 3 is a schematic illustration of a decoder circuit constructed in accordance with the present invention.

FIG. 3 illustrates a decoder circuit constructed in accordance with the invention. In the event that the decoder circuit is to analyze $n$ address signals, or $n$ is an integer, $n-1$ decoder transistors are arranged in parallel to one another. This means that their controlled paths lie in parallel to one another and one terminal of the controlled paths are connected to each other by a first connection line L1, whereas the other terminals of the controlled path are connected to each other by a second connection line L2. In the exemplary embodiment the control imputs of these $n-1$ decoder transistors DT1 to DT$n$ are supplied with the address signals A1 to A$n$ in negated or non-negated form. In the exemplary embodiment only two of these decoder transistors are illustrated, these being the decoder transistors DT1 and DT$n$, and these decoder transistors are fed with the address signal A1 and the address signal A$n$.

A further decoder transistor DTW is provided, whose controlled path is arranged between the first connection line L1 and a line for the operating voltage VSS. The control input of this further decoder transistor DTW is fed with the address signal A0, in negated form $\overline{A0}$.

Between the connection line L2 and the connection line for the operating voltage VSS is arranged an additional decoder transistor DTZ whose control imput is fed with the address signal A0 in non-negated form. The connection lines L1 and L2 form decoder output lines D$i$ and D$i$+1, respectively. These docoder output lines can be connected to the bit/word lines X1 and X$i$+1 without the interposition of an output amplifier. In the exemplary embodiment illustrated in FIG. 3, however, an output amplifier AV1 and AV2 is connected between the decoder output line D and the line X.

The construction of the output amplifier AV consists of a precharging transistor VT1, a cut-off transistor AT, a second precharging transistor VT2 and an output stage consisting of a switching transistor SCH and a coupling capacitor C. The pre-charging transistors VT1 and VT2 are fed with a timing signal S before the storage module is to be selected. As a result, the pre-charging transistors VT1 and VT2 are rendered conductive, and the decoder output line D and a point E are charged to a specific potential. During this time the cut-off transistor AT is blocked. To this end, its control input is fed with a voltage VDD - UT. Here, the potential VDD is a further operating voltage, and the potential UT is the threshold voltage of the cut-off transistor. The selection timing signal WA is connected to the output stage, i.e. to the switching transistor SCH. The precise mode of operation of the amplifier is known in the prior art and will not be discussed herein in further detail.

Making reference now to the pulse diagram of FIG. 4, the action of the decoder circuit will be described. Here, it is assumed that the MOS transistors are to be brought into the conductive state by means of high potential.

First of all, the signal S is applied. This signal has a high potential and consequently the pre-charging transistors VT1 and VT2 are driven conductive. The decoder output lines D$i$ and D$i$+1, and the points E$i$ and E$i$+1 can thus charge to high potential. During this time the decoder transistors DT are not connected with any address signals. The selection timing signal WA also is not connected. The low potential prevails on the lines X$i$ and X$i$+1 which are connected to the bit/word lines.

It will now be assumed that the address signal A0 and the address signals $\overline{A1}$, $\overline{An}$, are applied. Then, the additional decoder transistor DTZ is rendered conductive, whereas the other decoder transistors DT1, DT$n$ and DTW remain blocked. The result is that the decoder output lines D$i$+1 can discharge to the operating voltage VSS (VSS being a low potential), whereas the decoder output line D$i$ remains at high potential. As the signal S has previously been disconnected, the precharging transistors VT1 and VT2 of the output amplifier AV have passed into the blocked state.

As a result of the potential on the line D$i$+1, now the cut-off transistor AT of the output amplifier AV2 is driven conductive, and the point E$i$+1 can thus discharge to a low potential. On the other hand, the potential at the point E$i$ remains at its previous value. Therefore, higher potential prevails at the control input of the switching transistor SCH of the output amplifier AV1, whereas low potential prevails at the control input of the switching transistor SCH of the output amplifier AV2. If, now, the selection signal WA is connected, the switching transistor SCH of the output amplifier AV1 can pass into the conductive state, and thus high potential appears on the line X$i$. The feedback across the capacitor C serves to speed up this switch through process. Therefore, the line X$i$ has been selected.

As the point E$i$+1 carries low potential, the switching transistor SCH of the output amplifier AV2 cannot be brought into the conductive state, and the potential on the line X$i$+1 remains at a low value.

Figure 4:
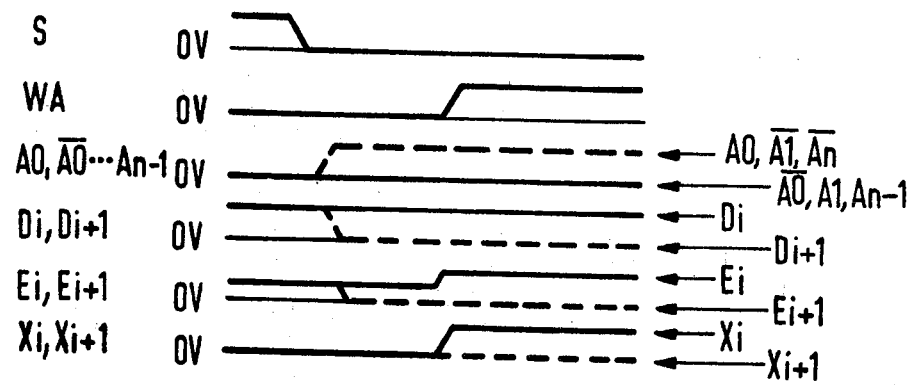
FIG. 4 is a pulse chart for the decoder circuit of the present invention corresponding to FIG. 3, in which the voltages are plotted with respect to time.

In FIG. 4, the broken lines indicate the case in which the output line X has not been selected, whereas the solid lines indicate the case in which the line X has been selected.

The exemplary embodiment discloses the situation in which the address signal A0 is connected in non-negated and in negated form to the decoder transistors DTW and DTZ. Naturally it is also possible to connect a different pair of address signal instead of these particular signals.

As can be seen from FIG. 3, the decoder circuit, in each case, controls two word or bit lines X. Thus, the same decoder transistors are utilized for the selection either of the one or of the other word or bit line X$i$, X$i$+1. For this reason, the number of decoder transistors per address line is considerably smaller.

Figure 5:
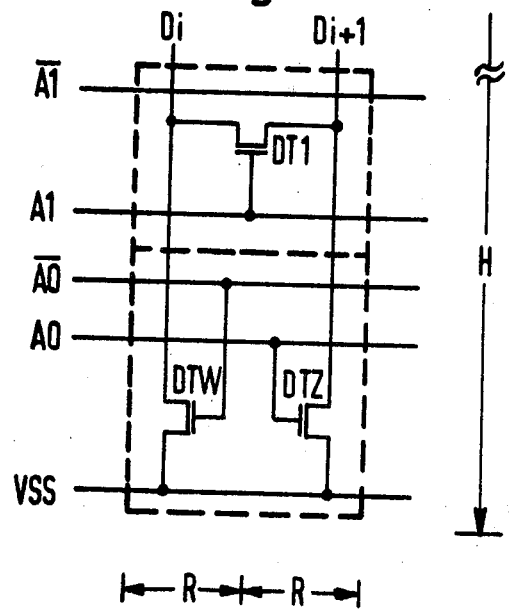
FIG. 5 is a schematic illustration of a decoder circuit constructed in accordance with the invention on the storage module.
Figure 8:
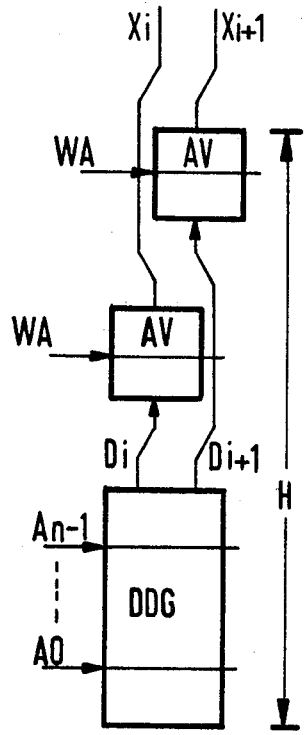
FIG. 8 is a schematic illustration of decoder circuits constructed in accordance with FIG. 5.

FIG. 5 illustrates how the decoder circuit can be arranged on a semiconductor module. It can be seen that the $n-1$ decoder transistors are arranged in parallel to the address lines. Now the address lines are designed as metal strips. The additional and the futher decoder transistors, on the other hand, are arranged with the controlled paths in the decoder output lines D$i$ and D$i$+1, and thus are arranged at right angles to the address lines. The decoder output lines D$i$ and D$i$+1 are diffused into the semiconductor substrate. Only one line is provided for the operating voltage VSS, which can be arranged at the lower edge of the decoder circuit. This can also consist of metal. As the same $n-1$ decoder transistors are in each case used for controlling two decoder output lines D$i$ and D$i$+1, the decoder grid R becomes considerably smaller in relation to FIG. 1. As in addition the $n-1$ decoder transistors DT lie in parallel to the address lines, the height H is also relatively low, i.e. very much smaller than in the decoder circuit illustrated in FIG. 2. These conditions are shown even better in FIG. 8. The decoder circuit for two decoder output lines D$i$ and D$i$+1 is referenced DDG. It will be seen that the decoder grid R is very small and that in addition the height H, which is formed by the decoder circuit DDG and the output amplifiers AV, is relatively small. In this case, the output amplifiers must again be arranged displaced from one another. Therefore, the embodiment constructed in accordance with the invention, of the decoder circuit, has considerably reduced the space requirement for the decoder circuit on the storage module.

For example, in the decoder circuit of FIG. 1, the decoder grid R = 30 $\mu$m, the height H = 445 $\mu$m and the decoder area per selected line $FD = R \cdot H = 13,350$ $\mu$m$^2$.

For the known decoder circuit illustrated in FIG. 2, the decoder grid R = 19 $\mu$m, the height H = 615 $\mu$m and the decoder area per selected line $FD = R \cdot H = 11,685$ $\mu$m$^2$.

The decoder circuit of the present invention can be constructed with the values in which the decoder grid R = 19 $\mu$m, the height H = 540 $\mu$m and the decoder area per selected line $FD = R \cdot H = 10,260$ $\mu$m$^2$.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A decoder circuit for a storage module including storage cells constructed from MOS transistors connected between word lines and bit lines, comprising:

decoder transistors each including two terminal controlled paths and a control input for receiving an address signal of $n$ address signals in negated and non-negated form;

a decoder output connected to one terminal of each of said controlled paths for providing a decoder output signal;

said decoder transistors comprising $n-1$ first decoder transistors arranged with their controlled paths in parallel;

a connection line connecting one terminal of each of said controlled paths of the $n-1$ first decoder transistors;

a second decoder transistor including a control input for receiving one of said address signals in negated form and a controlled path connected between the connection line and the operating voltage;

a second connection line connected to the other terminal of each of said $n-1$ first decoder transistors; and a third decoder transistor including a control input for receiving said one address signal in non-negated form and a controlled path connected between the operating voltage and said second connection line, said first and second connection lines defining respectively a decoder output line for selection of a word/bit line.

2. The decoder circuit of claim 1, comprising output amplifier means connected to said first and second connection lines.

3. The decoder circuit of claim 1, comprising address lines and an integrated circuit substrate, said $n-1$ first decoder transistors arranged in parallel to said address lines on said substrate, said second and third decoder transistors arranged on said substrate at right angles to said address lines, and a line for said operating voltage parallel to said address lines.

4. The decoder circuit of claim 3, wherein said address and supply voltage lines are metal strips on said substrate.

* * * * *